United States Patent [19]

Burt

[11] Patent Number: 4,760,435
[45] Date of Patent: Jul. 26, 1988

[54] ANTI-BLOOMING DRAIN STRUCTURE IN CHARGE COUPLED DEVICE IMAGE SENSORS

[75] Inventor: David J. Burt, London, England

[73] Assignee: The General Electric Company, p.l.c., England

[21] Appl. No.: 878,197

[22] Filed: Jun. 25, 1986

[30] Foreign Application Priority Data

Jul. 5, 1985 [GB] United Kingdom ............... 8517081

[51] Int. Cl.⁴ .................. H01L 29/78; H01L 27/14; H01L 31/00; H04N 3/14
[52] U.S. Cl. ...................................... 357/24; 357/30; 358/213.19
[58] Field of Search ............... 357/24, 30; 358/213.19

[56] References Cited

U.S. PATENT DOCUMENTS

| | | | |
|---|---|---|---|
| 3,932,775 | 1/1976 | Kosonocky | 307/311 |
| 4,028,716 | 6/1977 | van Santen et al. | 357/24 M |
| 4,207,477 | 6/1980 | Esser | 357/24 M |
| 4,485,315 | 11/1984 | Collet et al. | 357/24 LR |
| 4,593,303 | 6/1986 | Dyck et al. | 357/24 LR |
| 4,603,342 | 7/1986 | Savoye et al. | 357/24 LR |
| 4,607,429 | 8/1986 | Kosonocky | 357/24 LR |

Primary Examiner—Gene M. Munson
Attorney, Agent, or Firm—Kirschstein, Kirschstein, Ottinger & Israel

[57] ABSTRACT

A frame transfer buried channel CCD image sensor incorporating an anti-blooming drain structure (25, 27) wherein accumulation of charge of opposite polarity to that drained by the anti-blooming drain structure is prevented. This can conveniently be achieved by arranging for the buried channel diffusion (19) in each channel to stop short of the anti-blooming drain diffusion (25) on one side of each channel. As a result of the prevention of charge accumulation the anti-blooming drain structure remains effective with optical overloads much greater than the optical overload at which anti-blooming performance begins to deteriorate in conventional buried channel CCD image sensors.

4 Claims, 3 Drawing Sheets

ANTI-BLOOMING DRAIN STRUCTURE IN CHARGE COUPLED DEVICE IMAGE SENSORS

BACKGROUND OF THE INVENTION

1. Field of the Invention

This invention relates to charge coupled device (CCD) image sensors.

2. Description of Related Art

A CCD image sensor incorporates an array of semiconductor electric charge storage and transfer channels formed on a substrate. Each channel comprises a number of elements defined by an associated electrode structure to which electric potentials may be applied to cause electric charges stored in the channel to be transferred along the channel from element to element. In use, light representing an image is focussed onto the array so as to cause photogenerated charge of a predetermined polarity to accumulate in some of the elements of the array in a pattern corresponding to the image. The accumulated charges representing the image are then read out by transferring the charges along the channels to a read-out section of the sensor.

A well known problem that arises in use of CCD image sensors is that if more charge is generated in an element by light directed into the element than can be stored in that element, excess charge overflows into adjacent elements, this phenomenon being known as blooming.

It is therefore common practice to provide in a CCD image sensor a so-called anti-blooming drain, which serves to drain off excess photogenerated charge before it can reach adjacent elements. The form of anti-blooming drain employed depends on the form of the CCD array. In a CCD image sensor of the so-called frame transfer format wherein the channels of the array are disposed in parallel spaced relationship, an anti-blooming drain structure may be provided in the gap between each adjacent pair of channels. The drain structure includes an appropriately doped semiconductor region via which excess photogenerated charge will flow out of the device in preference to flowing to adjacent elements. To achieve such preferential flow the structure also includes means for producing a potential barrier between each element where photogenerated charge collects and the drain regions, which barrier is lower than the potential barriers along each channel which define the elements in which photogenerated charge collects.

In frame transfer format CCD image sensors of the so-called buried channel type, that is to say frame transfer sensors of the kind wherein charge is stored and transferred slightly below the surface of the semiconductor substrate, it is found that the anti-blooming drain begins to lose effectiveness at high optical overloads e.g. overloads in the region of one hundred times the optical load required to fully charge an element.

SUMMARY OF THE INVENTION

It is an object of the present invention to provide a frame transfer buried channel CCD sensor wherein this problem is alleviated.

According to the present invention there is provided a frame transfer buried channel CCD image sensor including an anti-blooming drain structure in which the accumulation of charge in said drain structure of opposite polarity to that drained by said drain structure to an extent sufficient to interfere with anti-blooming operation is substantially prevented.

In one embodiment of the invention said sensor is carried on a substrate and paths are provided along which said charge of opposite polarity will flow to said substrate to prevent accumulation to said extent.

In one particular such embodiment the sensor includes a plurality of charge storage and transfer channels disposed on said substrate in parallel spaced relationship with an anti-blooming drain structure disposed between each adjacent pair of channels, each drain structure including an appropriately doped semiconductor material of opposite conductivity type to the substrate, which strip abuts the said appropriately doped semiconductor region of the drain structure on one side of the channel but is spaced from the said region of the drain structure on the other side of the channel.

BRIEF DESCRIPTION OF THE DRAWINGS

The invention will now be further explained and one CCD image sensor in accordance with the invention will be described, by way of example, with reference to the accompanying drawings in which.

DETAILED DESCRIPTION OF THE PREFERRED EMBODIMENTS

Figure 1:
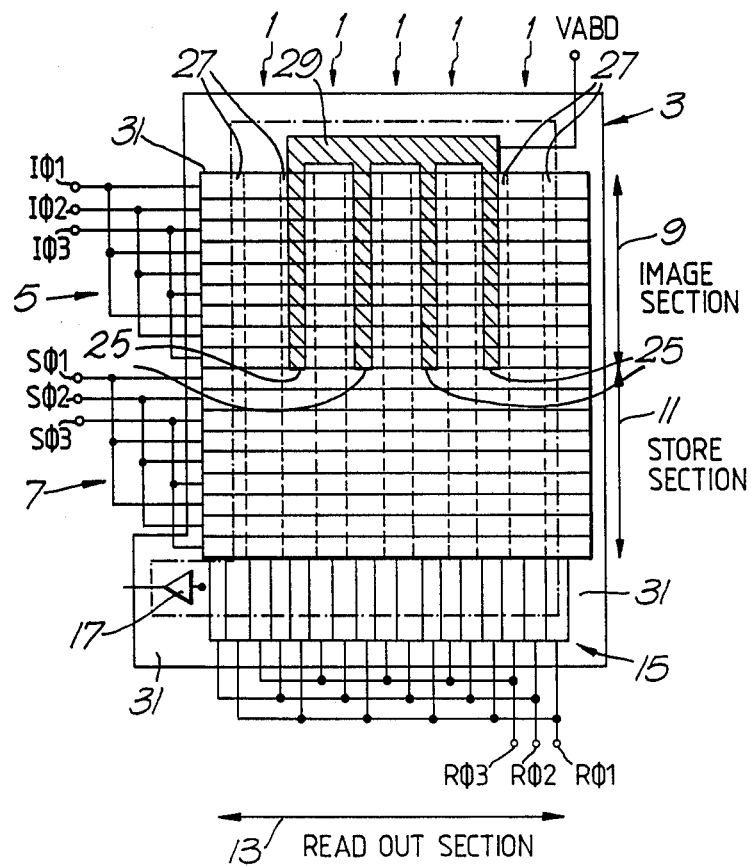
FIG. 1 is a diagrammatic plan view of a conventional frame transfer buried channel CCD image sensor including an anti-blooming drain.
Figure 2:
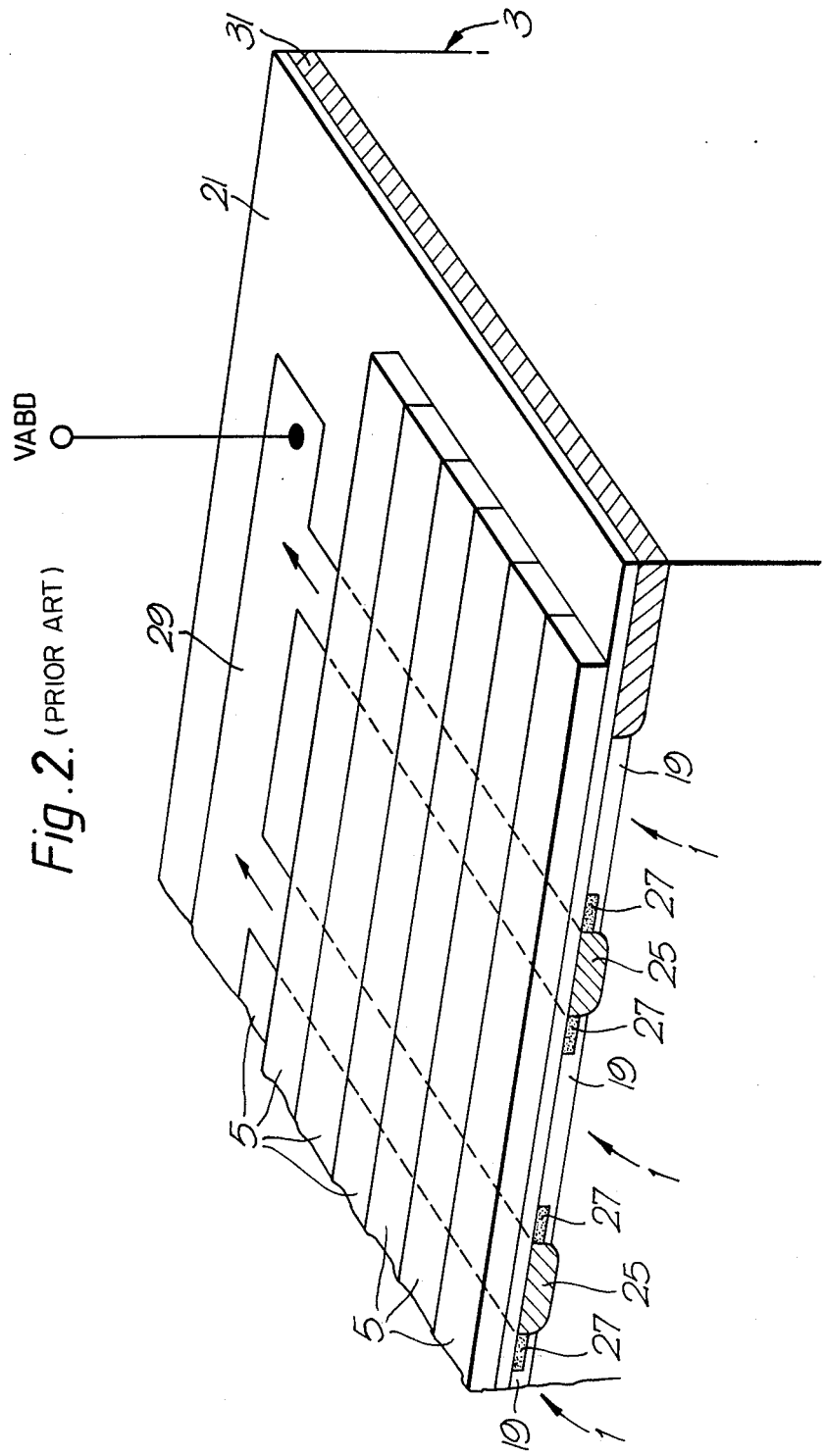
FIG. 2 is a diagrammatic perspective view of part of the sensor of FIG. 1.

Referring to FIGS. 1 and 2, in its conventional form a frame transfer buried channel CCD image sensor including an anti-blooming drain structure incorporates an array of charge storage and transfer channels 1 arranged side by side on a semiconductor substrate 3. In the drawing a relatively small number of channels only is shown for the sake of simplicity. Each channel 1 comprises a chain of electric charge storage elements which are defined by two three phase electrode structures 5 and 7, the electrodes of which extend across the substrate surface in a direction transverse to the length of the channels 1.

One half of the array, the upper half in FIG. 1, is open to light and forms an image section 9 of the sensor. The other half of the array is shielded from light and forms a store section 11 of the sensor.

At the end of the store section 11 remote from the image section 9 there is formed on the substrate 3 a read-out section 13 of the sensor constituted by a further charge storage and transfer channel extending transverse to the channels 1 of the store section 11 and having its own electrode structure 15.

The sensor further includes clock pulse generating means (not shown) for applying three-phase clock pulses $I\phi$, $S\phi$ and $R\phi$ to the electrode structures 5, 7 and 15 of the image, storage and read-out sections of the sensor respectively, and an amplifier 17 which amplifies the electrical output signal of the read-out section.

In operation of the sensor an optical image to be converted into an electrical signal is focussed onto the image section 9 of the sensor. The incident light causes electric charges to be generated in the elements of the image section 9 and stored in those elements which are biassed via the associated electrode structure 5 into a storage mode. Hence a stored charge pattern corresponding to the image accumulates in the image section 9. This charge pattern is then quickly transferred to the store section 11 by application of appropriate clock pulses I$\phi$, S$\phi$ to the electrode structures 5 and 7 of the image and storage sections. Whilst a further charge pattern collects in the image section 9, under the control of clock pulses S$\phi$ and R$\phi$ applied to the storage control and read-out sections the charge pattern stored in the store section 11 is transferred to, and read out by, the read-out section 13, line by line, to form an output electric signal representing the image. It will be appreciated that each line of the charge pattern is constituted by the charges in a different set of corresponding elements of the side-by-side channels 1.

The form of the charge storage and transfer array and the mechanism of charge storage and transfer will now be further described. By way of example, there will be described an array in which the charge carriers stored and transferred are electrons. It should however be understood that in other sensors holes instead of electrons may constitute the charge carriers.

Figure 3:
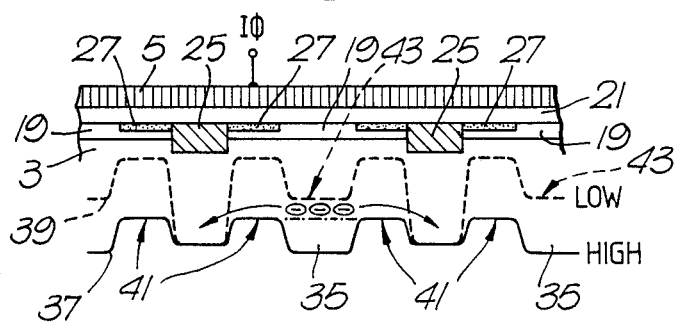
FIGS. 3, 4 and 5 are diagrams illustrating the operation of the sensor of FIGS. 1 and 2.

Referring now also to FIG. 3, each channel 1 of the array comprises a strip 19 of lightly doped n-type semiconductor material extending into the substrate 3 from one of its main faces, which main face carries a thin layer of insulating material 21. The insulating layer 21 is overlayed by a doped polycrystalline layer structure 30 which forms the electrode structures 5 and 7. Underlaying the n-type strips 19 is the substrate 3 consisting of lightly doped p-type material.

In the image section of the array, between each pair of adjacent channels 1, i.e. strips 19, there is an anti-blooming drain structure comprising a strip 25 of n-type material, constituting the drain of the structure, and on each side of each drain 25 a thin p-type strip 27 constituting the so-called barrier regions of the structure.

At the end of the image section 9 remote from the store section 11 the drains 25 are joined by a common connection 29 to which a suitable bias potential VABD is applied.

In the storage section 11 the barrier layers 27 are present but the drains 25 are omitted. Around the outer edge of the whole array and the read-out section 13 there is a p-type channel stop region 31, the channel stop region 31 extending into the p-type substrate 3 and being relatively highly doped.

In operation charge collection and/or storage occurs in an element of a channel when the electrode overlying that element is at a relatively high potential $V_H$ with respect to the potential $V_L$ of the electrodes overlying the adjacent elements.

Figure 4:
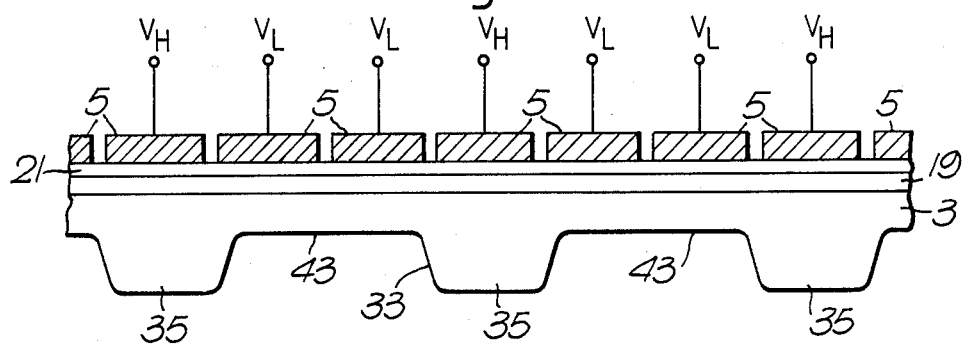

In FIG. 4 full line 33 indicates how the maximum potential varies along the length of a channel 1, the electron charge carriers collecting in the potential wells 35 under the electrodes 5 at high potential $V_H$.

It will be appreciated that in FIG. 4, line 33 merely indicates the variation of potential along the channel length and does not indicate the depth into the substrate at which the peak potentials occur, the peak potentials in fact occurring in the n-type strip 19. Charge transfer is effected by cycling the electrode potentials so causing the potential wells 35 and hence the charges collected therein to move along the channels 1.

It will be understood that the presence of n-type strips 19 in the channels 1 causes charge collection and transfer to occur below the substrate surface, so that the sensor is of the so-called buried channel type.

In the image and store sections collected charge is prevented from escaping sideways from one channel to another by virtue of the potential barriers created by the p-type barrier regions 27. This is illustrated by lines 37 and 39 in FIG. 3 which show the maximum potential variation along any single electrode of the electrode structure 5, the full line 37 showing the potential variation when the electrode is at high potential $V_H$, the dotted line 39 showing the potential variation when the electrode is at low potential $V_L$ and the potential barriers being indicated at 41.

It will be appreciated that as in the case of line 33 in FIG. 4, lines 37 and 39 in FIG. 3 do not indicate the depth at which potentials occur in the substrate 3.

Around the edge of the array and the read-out section 15 the channel stop region 31 performs a similar function to the barrier regions 27.

When charge carrier electrons collect in a potential well 35 the peak potential in the well decreases as charge accumulates. In the image section, under conditions of optical overload, if the amount of charge photogenerated and collected in an element reduces the peak potential in the well to a value equal to the peak potential 43 under an adjacent electrode at the low potential $V_L$, then charge escapes from the well to other elements in the array causing the phenomemon known as blooming. The anti-blooming structure prevents this by virtue of the fact that the potential barriers 41 created by the barrier regions 27 are more positive than the peak potentials 43 in the channels under the electrodes at low potential $V_L$. As a result, excess charge flows over the potential barriers 41 into the drains 25 and thence out of the device via the ABD connection rather than along the channels 1. It will be appreciated in this connection that the bias applied to the drains 25 must be such as to create a higher peak potential under the drains than under the barrier regions 27. It will further be appreciated that the potential barriers 41 adjacent the drains 25 could be created by suitably biassed electrodes instead of p-type barrier regions 27, or by a change of thickness of insulating layer 21 above the barrier regions.

With an image sensor of a structure as so far described it is typically found that the anti-blooming drain structure ceases to operate effectively at overloads of more than about 100 times the optical load required to fully fill a potential well 35 with charge.

The inventor has discovered that this loss of effectiveness is due to accumulation of charge carriers of opposite polarity to the charge carriers stored in the potential wells 35 of the channels, i.e. in the present example, to the accumulation of holes. It will be appreciated that such holes are photogenerated in operation in the same manner as the electron charge carriers.

Figure 5:
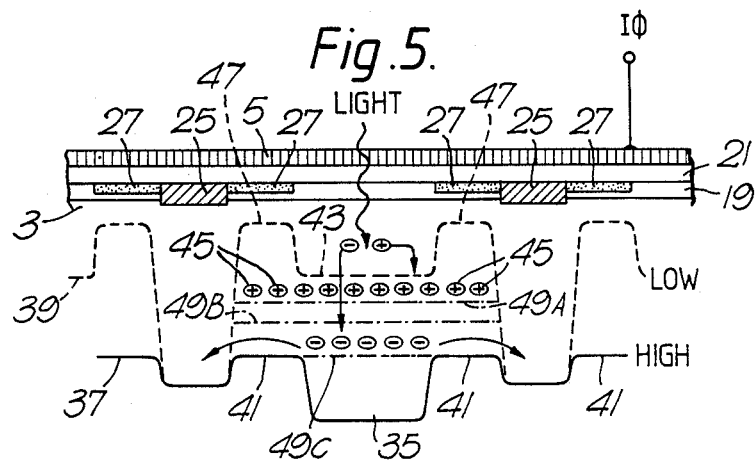

The mechanism by which accumulation of holes reduces the effectiveness of anti-blooming will now be described with reference to FIG. 5 which corresponds to FIG. 3.

When holes are photogenerated they will tend to accumulate in areas of least positive bias i.e. under the parts of the barrier regions 27 underlying those electrodes of electrode structure 5 which are at the lower potential $V_L$. Hole accumulation causes the potential in the semiconductor to increase positively so that with increasing hole accumulation the barrier potential 47 under the low biassed electrodes 5 will rise until it equals the peak potential 43 under the parts of the low biassed electrodes overlying the channels. Further accumulation of holes will then occur, as indicated at 45 in FIG. 5, along the whole length of the low biassed electrodes except in the drain regions 25 and raise the barrier/channel potential, as indicated by chain dotted lines 49A, 49B and 49C in FIG. 5, until it equals the barrier potential 41 under the high biassed electrodes 5. Excess electrons accumulating in the potential wells 35 in the channel regions under the high biassed electrodes will then no longer preferentially flow into the drains 25 and hence will flow along the channels 1 and cause blooming. Further hole accumulation will begin to raise the barrier potential 41 under the high biassed electrodes thus reducing the depth of the potential wells 35 in the channels 1 where electron charge carriers accumulate, so that the quantity of charge that is stored is reduced. This gives rise to a reduction of brightness in the centre of an overloaded region of an image, which is another phenomenon observed in blooming.

It will be understood that on frame transfer excess holes are removed from the image section so that overload effects are not cumulative from field to field.

In accordance with the present invention the reduction of effectiveness of anti-blooming due to hole accumulation is prevented by modifying the structure of the sensor so as to prevent hole accumulation under optical overload to such an extent as to interfere with anti-blooming.

Figure 6:
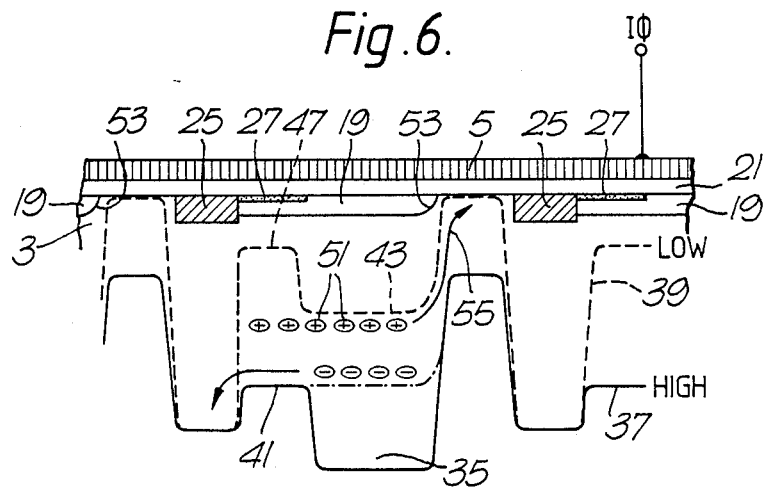
FIG. 6 is a diagram illustrating a CCD image sensor in accordance with the invention and its operation.

In a sensor of the form described above with reference to FIGS. 1 to 3, this may for example be achieved as illustrated in FIG. 6, by forming the n-type strips 19 in the image section 9 so that on one side 53 they stop short of the adjacent anti-blooming drain 25, and by omitting the barrier layer 27 on that side of each strip 19. Photogenerated holes 51 will now no longer accumulate under the barrier region 27 to a sufficient extent to raise the barrier potential 43, and interfere with anti-blooming, as described above, because an area of lower positive bias is now provided in the substrate 3 under the electrode 5 between the side 53 of the strip 19 and the adjacent drain 25, thus providing a path for holes 51 to flow to the substrate 3, as indicated by line 55 in FIG. 6.

It will be appreciated that draining of excess electron charge carriers to avoid blooming will still take place successfully from each channel 1 to the drain 25 on the side of the channel where a barrier layer 27 is still present.

It will be appreciated that whilst the strip 19 must stop short of the drain 25 on one side, the omission of the barrier layer 27 on that side of the strip 19, although preferable, is not essential.

In a sensor according to the invention the anti-blooming structure is typically found to be fully effective at all practical overloads, i.e. at overloads significantly greater than the overload at which effectiveness is lost in conventional sensors. The limit to device overload performance is now generally set by factors not associated with the anti-blooming drain structure, e.g. pick-up of spurious charge signals during the frame transfer operation.

It will be understood that in CCD image sensors of different form to that described above by way of example with reference to FIGS. 1 to 3, the modification of the structure whereby accumulation of holes is prevented may take a different form to that described by way of example.

I claim:

1. A frame transfer buried channel CCD image sensor, comprising: a semiconductor substrate; a plurality of charge storage and transfer channels disposed on the substrate in parallel spaced relationship; and between each adjacent pair of said channels, an anti-blooming drain structure, each channel adjoining the drain structure on one side thereof, but stopping short of the drain structure on the other side thereof, so that excess charge in each channel drains into said drain structure on said one side thereof, and charge of opposite polarity to that drained by said drain structure is provided with a path to the substrate between said channel and said drain structure on said other side thereof, thereby to limit accumulation of said charge of opposite polarity in said drain structure.

2. The sensor according to claim 1, wherein each said channel adjoins a respective said drain structure.

3. The sensor according to claim 1, wherein each said drain structure comprises a region of semiconductor material of opposite conductivity type to said substrate, and each said channel is defined by a region of semiconductor material of opposite conductivity type to said substrate which adjoins said drain structure region on one side thereof and stops short of said drain structure region on the other side thereof.

4. The sensor according to claim 3, wherein each said drain structure region, where adjoined by a said channel region, includes a further region of semiconductor material of opposite conductivity type to said drain structure and channel regions, said further region defining a barrier region.

* * * * *